United States Patent [19]
van Gestel

[11] Patent Number: 4,779,072
[45] Date of Patent: Oct. 18, 1988

[54] CHANNEL ENCODER

[75] Inventor: Wilhelmus J. van Gestel, Eindhoven, Netherlands

[73] Assignee: U.S. Philips Corporation, New York, N.Y.

[21] Appl. No.: 62,811

[22] Filed: Jun. 15, 1987

[30] Foreign Application Priority Data

Jun. 20, 1986 [NL] Netherlands ................. 8601603

[51] Int. Cl.$^4$ .............................................. H03M 7/14
[52] U.S. Cl. ........................................ 341/59; 360/40; 371/55; 371/56
[58] Field of Search .............. 340/347 DD; 360/40, 360/48; 371/55, 56; 375/19

[56] References Cited

U.S. PATENT DOCUMENTS 4,499,454  2/1985  Shimada ................. 340/347 DD
4,598,267  7/1986  Fukuda ................... 340/347 DD Primary Examiner—William M. Shoop, Jr.
Assistant Examiner—Richard K. Blum
Attorney, Agent, or Firm—Thomas A. Briody; Jack E. Haken; Anne E. Barschall

[57] ABSTRACT

On the basis of n-bit words presented, the described channel encoder generates DC-free and run length limited m-bit (m>n) code words having $(1+D)^{-1}$ or $(1+D^1)^{-1}$ precoder properties. The m-bit code words are formed each time by appending (m−n) bits to the n-bit words presented. For the determination of the (m−n) bits to be added, the amplitude density function as well as the distribution of the run length and the digital sum variation of the code words is calculated.

9 Claims, 3 Drawing Sheets

| i | DS | $DS_a$ (of $DS_b$) |
|---|---|---|
| 0 | -5 | 0 0 |
| 1 | -3 | 0 0 |
| 2 | -1 | 0 1 |
| 3 | -3 | 0 0 |
| 4 | 1 | 1 0 |
| 5 | -1 | 0 1 |
| 6 | -3 | 0 0 |
| 7 | -1 | 0 1 |
| 8 | 3 | 1 1 |
| 9 | 1 | 1 0 |
| 10 | -1 | 0 1 |
| 11 | 1 | 1 0 |
| 12 | -3 | 0 0 |
| 13 | -1 | 0 1 |
| 14 | 1 | 1 0 |
| 15 | -1 | 0 1 |

FIG.6A

| DSV | $DS_a$ | $DS_b$ | $x_a$ $x_b$ | DSV | $DS_a$ | $DS_b$ | $x_a$ $x_b$ |
|---|---|---|---|---|---|---|---|
| 4 | 0 0 | 0 0 | 0 0 | -2 | 0 0 | 0 0 | 1 0 |
| 4 | 0 0 | 0 1 | 0 0 | -2 | 0 0 | 0 1 | 1 0 |
| 4 | 0 0 | 1 0 | 0 1 | -2 | 0 0 | 1 0 | 1 1 |
| 4 | 0 0 | 1 1 | 0 1 | -2 | 0 0 | 1 1 | 1 1 |
| 4 | 0 1 | 0 0 | 0 0 | -2 | 0 1 | 0 0 | 1 1 |
| 4 | 0 1 | 0 1 | 0 0 | -2 | 0 1 | 0 1 | 1 1 |
| 4 | 0 1 | 1 0 | 0 1 | -2 | 0 1 | 1 0 | 1 0 |
| 4 | 0 1 | 1 1 | 0 1 | -2 | 0 1 | 1 1 | 1 0 |
| 4 | 1 0 | 0 0 | 1 0 | -2 | 1 0 | 0 0 | 0 1 |
| 4 | 1 0 | 0 1 | 1 0 | -2 | 1 0 | 0 1 | 0 1 |
| 4 | 1 0 | 1 0 | 1 1 | -2 | 1 0 | 1 0 | 0 0 |
| 4 | 1 0 | 1 1 | 1 1 | -2 | 1 0 | 1 1 | 0 0 |
| 4 | 1 1 | 0 0 | 1 0 | -2 | 1 1 | 0 0 | 0 0 |
| 4 | 1 1 | 0 1 | 1 0 | -2 | 1 1 | 0 1 | 0 0 |
| 4 | 1 1 | 1 0 | 1 1 | -2 | 1 1 | 1 0 | 0 1 |
| 4 | 1 1 | 1 1 | 1 1 | -2 | 1 1 | 1 1 | 0 1 |
| 2 | 0 0 | 0 0 | 0 1 | -4 | 0 0 | 0 0 | 1 1 |
| 2 | 0 0 | 0 1 | 0 1 | -4 | 0 0 | 0 1 | 1 1 |
| 2 | 0 0 | 1 0 | 0 0 | -4 | 0 0 | 1 0 | 1 0 |
| 2 | 0 0 | 1 1 | 0 0 | -4 | 0 0 | 1 1 | 1 0 |
| 2 | 0 1 | 0 0 | 0 0 | -4 | 0 1 | 0 0 | 1 1 |
| 2 | 0 1 | 0 1 | 0 0 | -4 | 0 1 | 0 1 | 1 1 |
| 2 | 0 1 | 1 0 | 0 1 | -4 | 0 1 | 1 0 | 1 0 |
| 2 | 0 1 | 1 1 | 0 1 | -4 | 0 1 | 1 1 | 1 0 |
| 2 | 1 0 | 0 0 | 1 0 | -4 | 1 0 | 0 0 | 0 1 |
| 2 | 1 0 | 0 1 | 1 0 | -4 | 1 0 | 0 1 | 0 1 |
| 2 | 1 0 | 1 0 | 1 1 | -4 | 1 0 | 1 0 | 0 0 |
| 2 | 1 0 | 1 1 | 1 1 | -4 | 1 0 | 1 1 | 0 0 |
| 2 | 1 1 | 0 0 | 1 1 | -4 | 1 1 | 0 0 | 0 1 |
| 2 | 1 1 | 0 1 | 1 1 | -4 | 1 1 | 0 1 | 0 1 |
| 2 | 1 1 | 1 0 | 1 0 | -4 | 1 1 | 1 0 | 0 0 |
| 2 | 1 1 | 1 1 | 1 0 | -4 | 1 1 | 1 1 | 0 0 |
| 0 | 0 0 | 0 0 | 1 0 | | | | |
| 0 | 0 0 | 0 1 | 1 0 | | | | |
| 0 | 0 0 | 1 0 | 1 1 | | | | |
| 0 | 0 0 | 1 1 | 1 1 | | | | |
| 0 | 0 1 | 0 0 | 1 0 | | | | |
| 0 | 0 1 | 0 1 | 1 0 | | | | |
| 0 | 0 1 | 1 0 | 1 1 | | | | |
| 0 | 0 1 | 1 1 | 1 1 | | | | |
| 0 | 1 0 | 0 0 | 0 0 | | | | |
| 0 | 1 0 | 0 1 | 0 0 | | | | |
| 0 | 1 0 | 1 0 | 0 1 | | | | |
| 0 | 1 0 | 1 1 | 0 1 | | | | |
| 0 | 1 1 | 0 0 | 0 0 | | | | |
| 0 | 1 1 | 0 1 | 0 0 | | | | |
| 0 | 1 1 | 1 0 | 0 1 | | | | |
| 0 | 1 1 | 1 1 | 0 1 | | | | |

FIG.6B

CHANNEL ENCODER

BACKGROUND OF THE INVENTION

1. Field of the Invention

The invention relates to a channel encoder for encoding received n-bits information words to m-bit, mainly DC-free, codewords, where $m>n$. The channel encoder comprises a memory circuit having an input connected to a counter. The memory circuit is provided for receiving each time the n-bit information word and the counter is provided for determining the digital sum variation (DSV) between two successive received binary words.

2. Prior Art

Channel encoders are widely used in digital magnetic recording and playback apparatus in order to adapt the inputted data stream to the characteristics of the data transmission channels. In such apparatus the flux is differentiated in time by the read head. Ignoring some high-frequency losses, this flux has the same shape as the write current applied to the write head. The output signal of the read head then consists of positive and negative pulses at the areas where transitions occur in the write current. In order to obtain a replica of the write current at the playback side in said apparatus, so-called pulse amplitude detection methods can be used in addition to the detection by so-called "write current restoration", that is to say by integration of the output signal of the read head. In the pulse amplitude detection methods the pulses in the output signal of the read head are detected. Even though the signal reproduced is always DC-free as a result of the differentiation, for the latter detection methods preferably the write current is also mainly DC-free, because otherwise problems could arise when (rotating) transformers are arranged between the write amplifier and the write head or when other signals (tracking tones) must alsio be recorded at low frequencies.

A channel encoder of this kind is known from the French patent application No. 2,469,047. In the known channel encoder the n-bit information word is supplied to the memory circuit as well as to the counter. The counter determines each time the digital sum variation between two successively supplied information words. The digital sum variation is determined in order to form the m-bits codeword and to provide that the coded signal thus formed is mainly DC-free. Therefore if the digital sum variation deviates too much from zero the supplied information word is inverted and the appended $(m-n)$ word indicates that inversion has occurred.

A drawback of the known encoder is that by using the n-bit information word for determining the digital sum variation it is not possible to use a precoder while maintaining the encoded signal mainly DC-free. Indeed if the encoded signal as provided by the known encoder should be supplied to a precoder, the outputted signal would no longer be DC-free.

SUMMARY OF THE INVENTION

It is an object of the present invention to provide an encoder which outputs a coded signal which is mainly DC-free and wherein by using a precoder a run length limited (RH) code word is obtained.

To achieve this, the channel encoder of the kind set forth in accordance with the invention is characterized in that the encoder comprises a precoder which is provided for supplying at an output of said encoder and to an input of said counter the m-bit codeword which is run length limited (RLL) and which is derived from the n-bit information word supplied to an input of said precoder in series with an $(m-n)$-bit word formed by said memory circuit on the basis of said digital sum variation and the digital sum of the m-bit codeword.

Because the counter now receives the m-bit codeword outputted by the precoder, the digital sum variation is now determined on the basis of the coded words and it is now possible to provide a mainly DC-free and run length limited coded signal. The $(m-n)$ bit word appended to the n-bit information word is generated by the memory circuit taking into account the supplied n-bit word and the digital sum variation. The fact that the encoded signal is run length limited enables the detection of error propagation in case that transitions are missed or when the initial value is incorrect.

A first preferred embodiment of a channel encoder according to the invention is characterized in that $(m-n)=1$, the precoder having a transfer function $(1+D)^{-1}$, D being the delay operator, said precoder output being connected to a further input of said memory circuit for inputting only the last bit of a preceding m-bit codeword said last bit being considered for said $(m-n)=1$ bit word.

When a precoder having a transfer function $(1+D)^{-1}$ is used only the last bit of the preceding m-bit codeword has to be taken into account.

Preferably the memory circuit comprises a memory wherein there is stored the digital sum for each of the m-bit codewords having passed the precoder following an m-bit codeword of which the last bit has a first predetermined value and which m-bit codewords being formed each time from a respective n-bits information word to which a 1-bit word having a second predetermined value has been appended. The use of the memory enables a simple realisation of the channel encoder. For example, the $(m-n)$ bit word "0" may be assumed to have been added to the n-bit information word, while a "0" is also assumed to have been applied to the precoder as the bit of the m-bit codeword supplied thereby. Using these two assumptions, the DS values in the memory are defined. The first assumption is corrected, if necessary, by the feedback via the DSV counter. The second assumption is corrected, if necessary, by the feedback of the last bit of the last m-bit codeword actually supplied by the precoder. Thus, the memory is filled in advance so that, when the device is in operation, an m-bit code word which is as DC free as possible, is supplied on the output of the channel encoder, with two possibilities for correction, one for each assumption in the determination of the DS values.

When $m-n=2$, use is made of a precoder having a transfer function $(1+D^2)^{-1}$. Only the last two bits of the preceding m-bit codeword are then used for determining the 2-bit encoding signal to be added to the n-bit information word. In that case, the memory circuit again includes a memory in which digital sum values (DS) are stored which have been determined by making assumptions analogous to those used in the former case where $m-n=1$.

Using precoders of this kind, a channel encoder can be obtained which supplies a mainly DC-free and RLL code, in which error propagation is prevented, in which the output signal of the relevant apparatus can be rendered independent of the polarity of the connection of the write head and/or read head, and in which a limited bandwidth can be realized, so that only little noise occurs. Further details of the channel encoder in accordance with the invention are given in the dependent claims.

BRIEF DESCRIPTION OF THE DRAWING

A number of embodiments in accordance with the invention will be described in detail hereinafter with reference to the accompanying diagrammatic drawings. Therein:

FIGS. 6a and 6b show tables for the memory circuit in the second embodiment of the channel encoder.

DETAILED DESCRIPTION OF THE PREFERRED EMBODIMENT

Figure 1:
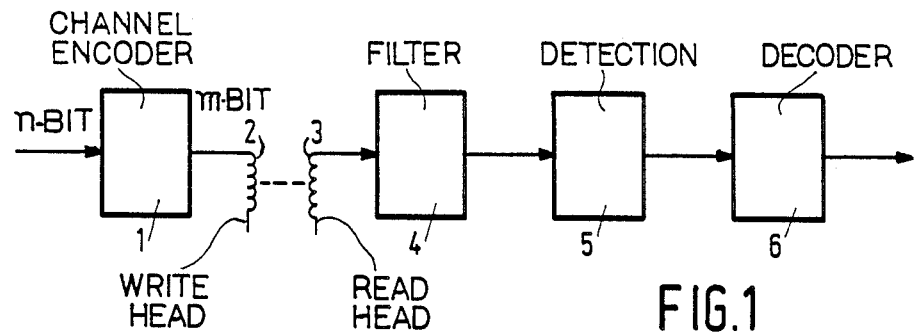
FIG. 1 shows a block diagram of the part of a digital magnetic recording and playback apparatus which is important for the description of a channel encoder.

FIG. 1 shows a block diagram of the part of a digital magnetic recording and playback apparatus which is of importance for the description of the channel encoder. The channel encoder is denoted by the reference numeral 1 in FIG. 1: in the encoder an n-bit data stream is encoded so that an m-bit, mainly DC-free and run length limited (RLL) code is obtained, where m>n. The DC level in the encoded bit stream is determined by the difference between the number of "ones" and "zeroes" in this bit stream. The run length is determined by the distance between the transitions in the encoded bit stream. The encoded bit stream, being the write current, is applied, via a write amplifier (not shown) and possibly a (rotating) transformer (not shown), to the write head 2 in order to record the encoded bit stream on a medium. During playback, this bit stream is read by means of the read head 3. The signal recorded on the medium is then differentiated in time. The differentiated signal is applied to a filter unit 4 in which, ignoring high-frequency losses, a more or less flat frequency response curve is obtained, resulting in δ-pulse shaped signals at the transitions in the signal read, after which such an output signal is supplied, using a Nyquist pulse shaping filter, so that the detection in the detection unit 5 produces a signal which corresponds to the differentiated write current. A restored bit stream is further derived from this signal in the detector. This bit stream should subsequently be decoded again. This operation takes place in the decoder 6, after which the n-bit data stream has been obtained again.

Figure 2:
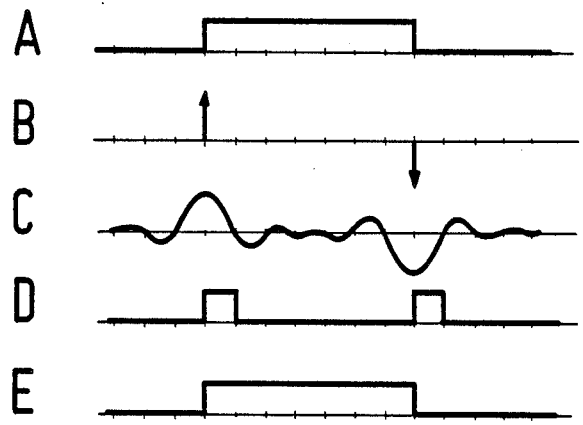
FIG. 2 shows a number of diagrams in support of the description of the operation of the circuit shown in FIG. 1.

The reference A in FIG. 2 denotes the write current to be applied to the write head. The reference B denotes the δ-pulse shaped signals obtained in the filter unit 4. The reference C denotes the signal obtained after Nyquist pulse shaping and supplied by the filter unit 4. The reference D denotes the detected output signal corresponding to the differentiated write current; and the reference E denotes the restored encoded bit stream.

Figure 3:
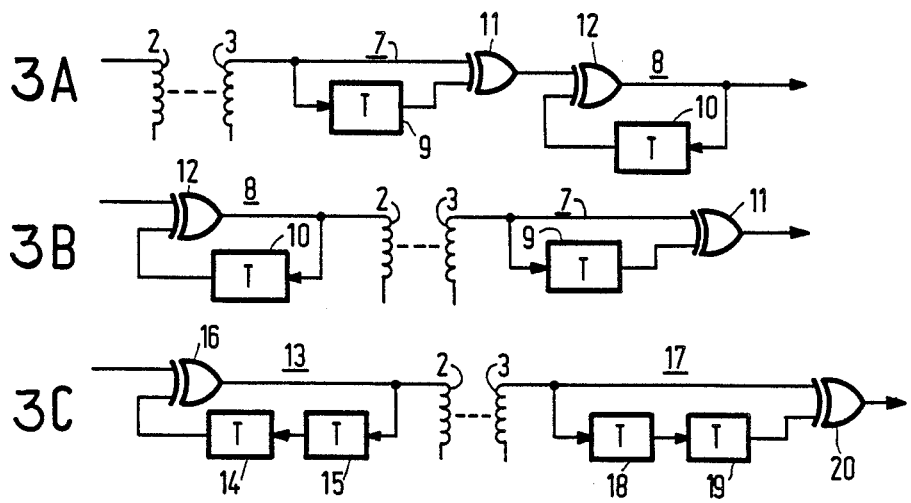
FIG. 3 shows three simplified circuits for illustrating the use of a precoder in a channel encoder.

In as far as is relevant, the described circuit can be simplified to the circuit shown in FIG. 3a, from a digital and time discrete point of view. Upon playback, differentiation of the bit stream occurs, implying a multiplication by $(1+D)$, where D represents the delay operator. This operation is indicated by the functional network 7. The restoration of the encoded bit stream takes place in the detector, implying a multiplication by $(1+D)^{-1}$. This operation is indicated by the functional network 8. When a transition is missed in the detector during playback or when the write head and/or the read head is connected with the wrong polarity, error propagation occurs. When the encoded bit stream is multiplied by $(1+D)^{-1}$ at the recording side where no errors have occurred yet, instead of in the detector at the playback side, the detector receives directly the original encoded bit stream instead of the signal corresponding to the differentiated write current. This situation is shown in FIG. 3b. In this figure, the functional network 8 is inserted in the recording transmission channel. In this configuration the functional network 8 forms a so-called precoder which is connected directly to the channel encoder 1 or is integrated therein. In the FIGS. 3a and 3b, each of the functional networks 7 and 8 is composed of a delay element 9, 10, respectively, and an EXCLUSIVE-OR gate 11, 12, respectively. The delay time T corresponds to one bit cell of the bit stream. In the configuration shown in FIG. 3b, missing a transition does not lead to error propagation and the polarity of the signal read with respect to the write current is no longer of importance. This will be explained on the basis of an example.

For example, when bit series 001100101 is applied to the network 8 in FIG. 3b, the write current will be formed by the bit series 001000110 if the delay element 10 initially supplies the bit value 0. If the delay elemnt 10 initially supplies the bit value 1, the write current will be formed by the bit series 110111001. Upon differentiation in the network 7, the bit series which are the inverse of one another, the bit series 001000110 preceded by the bit value 0 and the bit series 110111001 preceded by the bit value 1, are converted into the same bit series 001100101. In other words, the polarity of the bit current read with respect to the write current is no longer important. The missing of a transition during the detection of the signal differentiated in the read head will no longer cause error propagation.

FIG. 3c shows a circuit which is analogous to that shown in FIG. 3b. Therein, the functional network 13, consisting of two delay elements 14 and 15 and an EXCLUSIVE-OR gate 16, acts as a precoder. The functional network 17 which is composed of two delay elements 18 and 19 and an EXCLUSIVE-OR gate 20 indicates the differentiation taking place in the playback channel. In this case, the write current is multiplied by $(1+D^2)^{-1}$, a multiplication by $(1+D^2)$ taking place in the playback channel.

When, for example the bit series 001100101 is applied to the network 13 in FIG. 3c, the write current will be formed by the bit series 001111011 if the delay elements 14, 15 initially supply the bit values 00. If the delay elements 14, 15 initially supply the bit values 10, the write current will be formed by the bit series 011010001; if the delay elements 14, 15 initially supply the bit values 01, the write current will be formed by the bit series 100101110. If the delay elements 14, 15 initially supply the bit values 11, the write current will be formed by the bit series 110000100. Two by two, these bit series are the inverse of one another. Upon differentiation in the network 17, all four bit series, each series with the associated preceding two bit values, is converted into the same bit series 001100101. The circuit shown in FIG. 3c not only has the same attractive properties as the circuit shown in FIG. 3b, but offers the additional advantage that the bandwidth is smaller so that the noise is less.

Figure 4:
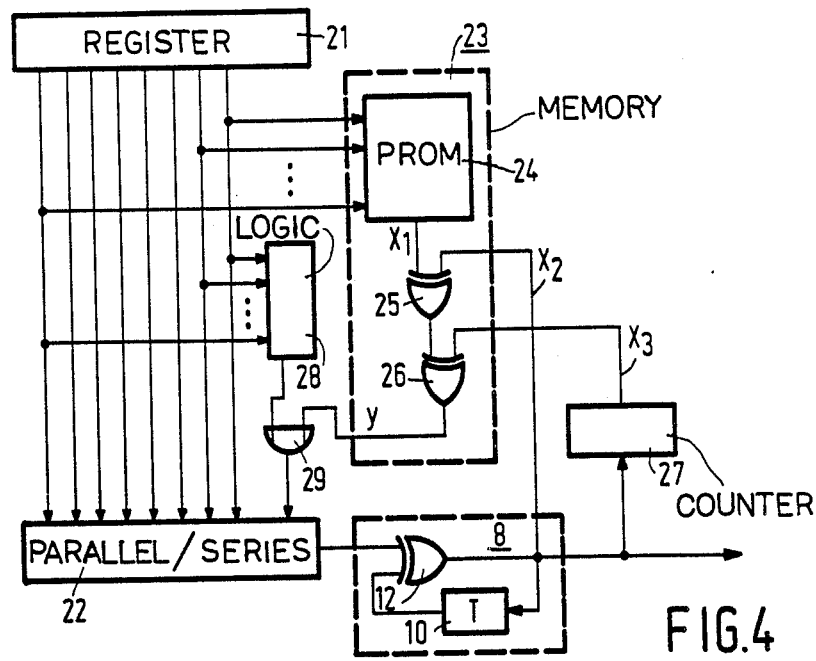
FIG. 4 shows an embodiment of a channel encoder in accordance with the invention.

FIG. 4 shows a first embodiment of a channel encoder in accordance with the invention. The construction and operation of this channel encoder will be described, by way of example, on the basis of an 8→9 channel encoder. This means that an 8-bit information word is converted into a 9-bit code word mainly DC-free and RLL. however, this construction is in principle suitable for any n→n+1 channel encoder.

The 8-bit information word to be encoded is written into a register 21. From this register these 8 bits are applied in parallel to a register cum parallel-series converter 22 as well as to a memory circuit 23. In the present embodiment, this memory circuit 23 comprises an 8→1 PROM 24 in which there are stored the digital sum values DS of the 9-bit words. These values have been composed by appending each time a 1-bit encoding signal of predetermined fixed value, in this case, for example 0, to the 8-bit information word. The combination thus obtained has passed the precoder connected to the memory circuit 23 via the register cum parallel-series converter 22. In the memory circuit 23, a last bit of fixed value, in this case, for example 0, of the preceding 9-bit code word supplied by the precoder 8 is applied to the precoder 8. For example, when the 8-bit word 01100101 is applied to the PROM 24, a DS value −3 is addressed in this memory. This value has been determined in advance as follows: a 9-bit word is assumed by assuming the 1-bit encoding signal 0 to have been appended, i.e. 001100101. When this 9-bit word is assumed to have passed through the precoder 8, it also being assumed that the delay element 10 initially supplies the bit value 0. The precoder would supply the 9-bit word 001000110. Because the digital sum value DS of a word is to be understood to mean the difference between the number of "ones" and the number of "zeroes" of this word, in this case DS=3. Thus, for any feasible 8-bit data word a DS value is present in the PROM 24. The following holds for the signal $x_1$ to be output by PROM 24: $x_1=0$ if DS≧0, and $x_1=1$ if DS<0. The assumptions built into the signal $x_1$, however, may require correction. To this end, the memory circuit 23 also comprises two EXCLUSIVE-OR gates 25 and 26. The EXCLUSIVE-OR gate 25 not only reacts to the signal $x_1$ from the 8→1 PROM 24, but also to the signal $x_2$. This is the last bit of the last 9-bit code supplied by the precoder 8. The EXCLUSIVE-OR gate 26 reacts not only to the output signal of the EXCLUSIVE-OR gate 25, but also to the output signal $x_3$ of a DSV counter 27. This is the counter in which the digital sum variation DSV of the encoded bit word each time obtained thus far is determined. To this end, the DSV counter 27 each time receives the 9-bit code from the precoder 8. The output signal $x_3$ of the DSV counter 27 is 1 if the digital sum variation DSV is larger than or equal to 0; $x_3=0$ if DSV is smaller than 0. The transfer function of the logic circuit formed by the two EXCLUSIVE-OR gates 25 and 26 can be expressed in Boolean form as follows:

$$y = x_1 x_2 x_3 + x_1 \overline{x_2 x_3} + x_1 \overline{x_2} x_3 + \overline{x_1} \overline{x_2} x_3$$

and determines the bit which is added to the 8-bit information word in order to obtain a 9-bit encoded word.

The embodiment shown in FIG. 4 also comprises a further logic circuit 28 and an OR gate 29. The 8-bit information word is applied to the logic circuit 28. In reaction thereto, this logic circuit 28 supplies a zero detection signal "1" if the 8-bit information word consists only of "zeroes". This zero detection signal as well as the cited signal y is applied to the OR-gate 29. The output signal of the OR-gate forms the 1-bit encoding signal to be added to the 8-bit information word. Thus, an excessive run length is prevented. Regardless of the DC deviation of the encoded bit stream obtained thus far, a 1 is added to an 8-bit word which consists only of "zeroes", so that at least one transition occurs per 9-bit word in the encoded bit stream.

It is assumed, by way of example, that the word 01100101 is supplied as the 8-bit data stream. As has already been demonstrated, for this word DS=−3, so that $x_1=1$. Four cases then occur:

For the DSV of the encoded bit stream obtained thus far it holds good that DSV<0, so $x_3=0$, while the last bit $x_2$ output by the precoder is 0. In that case y=1. The 9-bit signal applied to the precoder is then 101100101. In response thereto, the precoder supplies the signal 110111001. Upon differentiation during playback, this signal produces the bit series 101100101, while the original word 01100101 is obtained again by omission of the bit added during recording. The vaue of DSV which was negative is now incremented by the digital sum value of the 9 bits supplied by the precoder, in this example +3.

For the DSV of the encoded bit stream obtained thus far, DSV<0, so $x_3=0$, while the last bit $x_2$ supplied by the precoder is 1. In that case y=0. The 9-bit word applied to the precoder is then 001100101. In response thereto, the precoder supplies the word 110111001. Upon differentiation during playback, this signal produces the bit series 001100101, while the original word 01100101 is obtained again by omission of the bit added during recording. The value of DSV which was negative is increased again by +3.

For the DSV of the encoded bit stream obtained thus far, DSV≧0, so $x_3=1$, while the last bit $x_2$ supplied by the precoder is 0. In that case y=0. The 9-bit word applied to the precoder is then 001100101. In response thereto, the precoder supplies the word 001000110. Upon differentiation, this word forms the bit series 001100101, while the original signal is obtained again by omission of the previously added bit. The DSV is increased by −3.

For the DSV of the encoded bit stream obtained thus far DSV≧0, so $x_3=1$, while the last bit $x_2$ supplied by the precoder is 1. In that case y=1. The 9-bit word applied to the precoder is then 101100101. In response thereto, the precoder supplies the word 001000110. Upon differentiation, this word forms the bit series 101100101, while the original word is obtained again by omission of the previously added bit. The DSV is increased again by −3.

When a series of 8-bit words is applied to the channel encoder, the DSV will fluctuate around 0 as much as possible in order to obtain a mainly DC-free code.

It is assumed that, starting with the initial situation DSV=0, so $x_3=1$ and $x_2=0$, the 8-bit words 11110000, 00000000, 00011111, 01100101 are successively applied. If a 0 were added to the second word and the third word, 17 "zeroes" would succeed one another, so that an excessive run length would occur. Therefore, this situation is avoided by the circuit shown. After application of the first word to the PROM 24, for which DS=−5, the signal $x_1=1$ is output. For $x_2, x_3=0, 1$ this results in y=0. 011110000 is applied to the precoder. In response thereto, the precoder supplies the bit series 010100000, so that DSV assumes the value −5 and $x_3$ becomes 0; $x_2$ remains 0. For the second word, the circuit 28 outputs the zero detection signal 1, so that the 9-bit word applied to the precoder becomes 100000000. In response thereto, the precoder supplies the word 111111111, so that DSV is increased by +9 and assumes the value +4. Furthermore, $x_2$, $x_3=1$, 1. For the third word, DS=−3, so that $x_1=1$. In that case y=1. Thus between the second word and the third word a 1 is added, so that the run length remains limited to 9 in this case. After application of the bit series 100011111 to the precoder, the precoder supplies the word 000010101, so that DSV is increased by −3 and assumes the value +1. After the third word, $x_2$, $x_3=1$, 1. After application of the fourth word, for which DS=−3 and hence $x_1=1$, y will become 1 and the bit series 101100101 will be applied tto the precoder. In response thereto, the precoder supplies the word 001000110, so that DSV changes from +1 to −2.

Figure 5:
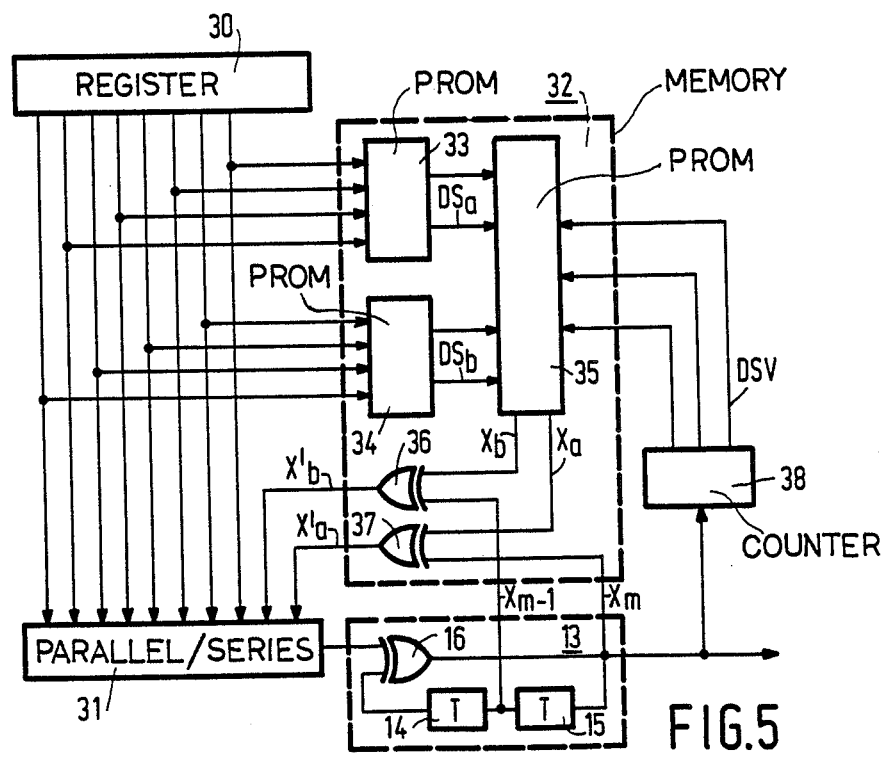
FIG. 5 shows a second embodiment of a channel encoder in accordance with the invention.

FIG. 5 shows a second embodiment of a channel encoder in accordance with the invention. The construction and operation of this channel encoder will be described, by way of example, on the basis of an 8→10 channel encoder, which means that an 8-bit information word is converted into a 10-bit mainly DC-free RLL code. This embodiment, however, is in principle also suitable for any n→n+2 channel encoder.

The 8-bit information word to be encoded is written into a register 30. From this register the 8 bits are applied in parallel to a register cum parallel/series converter 31 as well as to a memory circuit 32. The memory circuit includes a PROM 35 for outputting two bits $x_a$, $x_b$ on the basis of the applied 8-bit data and the in this case 3-bit encoded DSV output signal. Thus, use can be made of an 11→2 PROM. In order to save storage space, however, the present embodiment utilizes a first sub-memory 33 which responds to the even bits of the 8-bit information word by supplying a 2-bit partial digital sum value $DS_a$, and a second sub-memory 34 which responds to the odd bits of the 8-bit information word by supplying a 2-bit partial digital sum value $DS_b$; there is also provided a third sub-memory 35 in which said bits $x_a$, $x_b$ are formed from the partial digital sum values $DS_a$ and $DS_b$ and from the 3-bit DSV value. The present embodiment, therefore, utilizes two 4→2 PROMs and one 7→2 PROM. The partial digital sum values $DS_a$ and $DS_b$ are determined in the same way as the digital sum values DS in the first embodiment. This means that the sub-memories 33 and 34 store the digital sum values $DS_a$ and $DS_b$, respectively, of the (in the present case) 5-bit words which are assumed to have been composed by assuming a bit $x'_a=0$ and a bit $x'_b=0$ to have been added to the 4-bit words applied to the sub-memories 33 and 34, respectively, and by assuming the assumed combination thus obtained to have passed the precoder 13, the last bits $x_{m-1}=0$ and $x_m=0$ of the 10-bit code last supplied by the precoder being assumed to have been applied to the precoder. For example, when the 8-bit information word 01100101 is output by the register 30, the sub-word 0100 is applied to the sub-memory 33. Thus, a digital sum value $DS_a=+1$ is addressed which is determined in advance as follows: the bit $x'_a=0$ is assumed to be added, so that the word 00100 is assumed to have been applied to the precoder. For $x_m=0$, the precoder would then output the word 00111 having a digital sum value $DS_a=+1$. The sub-word 1011 is applied to the sub-memory 34. Thus a digital sum value $DS_b=+1$ is addressed which is determined in advance as follows: the bit $x'_b=0$ is assumed to have been added, so that the word 01011 is assumed to have been applied to the precoder. For $x_{m-1}=0$, the precoder would then output the word 01101 having a digital sum value $DS_b=+1$. In the present embodiment, n is even so that the sub-memories 33 and 34 have the same capacity. This will not be the case when n is odd.

The memory circuit 32 furthermore comprises two EXCLUSIVE-OR gates 36 and 37 which respond to the signals $x_a$, $x_b$ and the signals $x_{m-1}$ and $x_m$ originating from the precoder 13, respectively, by supplying the bits $x'_a$ and $x'_b$, respectively, to be added, so that a 10-bit word is applied to the decoder 13 from the register cum parallel/series converter 31. The precoder to be used herein is of the type shown in FIG. 3c. The bits $x_m$ and $x_{m-1}$ form each time the last two bits of the last word supplied by this precoder. The 10-bit code of the precoder is also applied to the DSV counter 38 which applies the DSV value, encoded in 3 bits, to the memory circuit 32. The memory circuit of this embodiment is again constructed so that the PROMs are filled so that the encoded bit stream has a minimum DSV and a limited run length.

FIG. 6a shows an example of a table contained in the PROMs 33 and 34. For the 4-bit input signal of these PROMs, the DS values −5, −3, ... −1 hold good for the increasing decimal values 0, 1, 2, ... 15. These DS values have been determined in the described manner. For the 2-bit signal $DS_a$ (or $DS_b$) supplied, it holds that $DS_a$ (or $DS_b$)=1, 1 if DS=+3; $DS_a$ (or $DS_b$)=1, 0 if DS=+1; $DS_a$ (or $DS_b$)=0, 1 if DS=−1, and $DS_a$ (or $DS_b$)=0, 0 if DS=−3 or −5.

FIG. 6b shows an example of a table contained in the PROM 35. This memory receives the 2-bit signals $DS_a$ and $DS_b$ and alos the 3-bit DSV values. For 10-bit words the DSV counter 38 supplies an output signal 111 if DSV≧+6, 110 if DSV=+4, 101 if DSV=+2, 100 if DSV=0, 001 if DSV=−2, 010 if DSV=−4, and 011 if DSV≦−6; the value 000 is not used in this case. In the present embodiment DSV remains within the limits [4, −4], so that the table of FIG. 6b contains only the bits $x_a$, $x_b$ for the DSV values +4, +2, 0, −2, −4 and the $DS_a$ and $DS_b$ values 00, 01, 10 and 11.

Assuming that, using the initial situation DSV=0 and $x_m$, $x_{m-1}=0$, 0, the 8-bit words 11110000, 00000000, 00011111 and 00100101 are successively supplied again. The bit groups 1100, 0000, 0011 and 0100 are then successively applied to the PROM 33, so that $DS_a$ successively assumes the values 00, 00, 00 and 10. The bit groups 1100, 0000, 0111 and 0011 are applied to the PROM 34, so that $DS_b$ successively assumes the values 00, 00, 01 and 00.

When the first 8-bit word is applied, DSV=0, so that $x_a$, $x_b=1$, 0 and $x'_a$, $x'_b=1$, 0. The bit series 1011110000 is then applied to the precoder. In response thereto, the precoder supplies the signal 1001101010, so that $x_m$, $x_{m-1}=0$, 1 and DSV remains 0. When the second 8-bit word has been applied, $x_a$, $x_b$ remains 1, 0 and $x'_a$, $x'_b=1$, 1. The bit series 1100000000 is then applied to the precoder. In response thereto, the precoder supplies the signal 0101010101, so that $x_m$, $x_{m-1}=1$, 0 and DSV remains 0. When the third 8-bit word has been applied, $x_a$, $x_b$ remains 1, 0 and $x'_a$, $x'_b=0$, 0. The bit series 0000011111 is then applied to the precoder, which then supplies the signal 0101001100, so that $x_m$, $x_{m-1}=0$, 0 and DSV changes from 0 to −2. When the fourth 8-bit word has been applied, $x_a$, $x_b$=0, 1 and $x'_a$, $x'_b$=0, 1. The bit series 0100100101 is then applied to the precoder. In response thereto, the precoder supplies the signal 0101111011 so that $x_m$, $x_{m-1}$=1, 1 and DSV changes from −2 to +2. It will be apparent from this example that DSV remains between the limits [+4, −4] and hence that the DC value remains minimum. The bits 11 are added between the first and the second word so that the run length remains limited. In determining the contents of the sub-memories, the criterion that the DSV must remain minimum, as well as the criterion that the run length must remain limited, has been taken into account. When the deviation of DSV from 0 is excessive, the first criterion will be decisive. When the run length becomes too large, the second criterion will be decisive.

In the second embodiment, utilizing a precoder having a transfer function $(1+D^2)^{-1}$, 2 bits were added to the n-bit data stream. For a 8→10 conversion this implies a 25% increase in channel bits. If this increase is to be limited, an 8→9 conversion may be adopted; however, if it is desirable to retain the properties of the precoder used in the second embodiment, use can be made of a precoder having the transfer function $(1+D)^{-1}$, but interleaving with an interleave factor 2 must be used.

In the described embodiments of the channel encoder in accordance with the invention the digital sum variation of the encoded bit stream is readjusted to 0 in order to obtain a signal which is as DC-free as possible. However, it may also be desirable to introduce so-called tracking frequencies into the encoded bit stream. This can be realized by readjusting the digital sum variation of the encoded bit stream to alternately a positive value and a negative value instead of to 0. To this end, for example the memory circuit can be constructed so as to be double, so that the desired frequency to be inserted into the encoded bit stream can be used to switch between these two memory circuits. The PROMs f the relevant memory circuits are filled so that bits to be added are obtained which readjust the encoded bit stream to the desired positive and negative value. The digital sum variation each time found can also be periodically corrected.

What is claimed is:

1. A channel encoder for encoding received n-bit information words into m-bit, mainly DC-free, code words, where m>n, said channel encoder comprising:
    a. a precoder having a transfer function $(1+D^{m-n})^{-1}$, where D is a delay operator, said precoder having an input for receiving said n-bit information words in series with (m−n)-bit words and an output for supplying said m-bit code words, said precoder forming said m-bit code words from said n-bit information words and said (m−n)-bit words, so that said m-bit code words are run length limited;
    b. a counter for determining a digital sum variation (DSV) between two successive m-bit code words, said counter having an input coupled with the output of said precoder for receiving said m-bit code words, and an output at which said digital sum variation is provided; and
    c. a memory circuit having a first input coupled with the output of the counter for receiving said digital sum variation, a second input for receiving said n-bit information words, and a third input coupled with said precoder for receiving said m-bit code words, said memory circuit forming a digital sum value of said m-bit code words and forming said (m−n)-bit words by logically combining said digital sum value with said digital sum variation and (m−n) bits of received m-bit code words, said memory circuit having an output for supplying said (m−n)-bit words.

2. A channel encoder for encoding received n-bit information words into m-bit, mainly DC-free, code words, where m>n, the channel encoder comprising:
    a. a precoder having a transfer function $(1+D)^{-1}$ and forming said m-bit code words from said n-bit information words and from (m−n)-bit words, so that said m-bit code words are run length limited, said precoder having an input for receiving said n-bit information words in series with said (m−n)-bit words and an output at which said m-bit code words are provided, where (m−n)=1, and D is a delay operator;
    b. a counter for determining a digital sum variation (DSV) between two successive m-bit code words, said counter having an input coupled with the output of said precoder for receiving said m-bit code words, and an output at which said digital sum variation is provided;
    c. a memory circuit having a first input coupled with the counter for receiving said digital sum variation, a second input for receiving said n-bit information words, and a third input for receiving a last bit of said m-bit code words, said memory circuit forming the (m−n)-bit words from said digital sum variation, said m-bit information words and said last bit of said code words.

3. A channel encoder as claimed in claim 2, characterized in that the memory circuit comprises a memory wherein there is stored the digital sum for each of the m-bits code words having passed the precoder following an m-bits codeword which last bit has a first predetermined value and which m-bits codewords being formed each time from a respective n-bits information word to which a 1-bit word having a second predetermined value has been appended.

4. A channel encoder as claimed in claim 3, characterized in that the memory circuit also includes a logic circuit connected to a data output of said memory and having the transfer function $$y=x_1x_2x_3+\bar{x}_1x_2\bar{x}_3+\bar{x}_1x_2\bar{x}_3+\bar{x}_1\bar{x}_2x_3$$

where $x_1$ represents a standard for the relevant digital sum value (DS), $x_2$ represents said last bit supplied by the precoder, and $x_3$ represents a standard for said digital sum variation (DSV), y being the value of the bit to be appended to the n-bit information word.

5. A channel encoder as claimed in claim 4, characterized in that said encoder comprises a zero detector whereto the n-bit information word is applied and which supplies a zero detection signal when the n-bit information word consists only of zeroes, said zero detection signal respectively said signal y being applied to a first respectively a second input of a logic OR-gate at which output said 1-bit word being supplied.

6. A channel encoder for encoding received n-bit information words into m-bit, mainly DC-free, code words, where m>n, the channel encoder comprising:
    a. a precoder having a transfer function $(1+D^2)^{-1}$ and forming said m-bit code words from said n-bit information words and from (m−n) bit words, so that said m-bit code words are run length limited, said precoder having an input for receiving said n-bit information words in series with said (m−n)-bit words and an output at which said m-bit code words are provided, where (m−n)=2, and D is a delay operator;

b. a counter for determining a digital sum variation (DSV) between two successive m-bit code words, said counter having an input coupled with the output of said precoder for receiving said m-bit code words, and an output at which said digital sum variation is provided; and c. a memory circuit having a first input coupled with the counter for receiving said digital sum variation, a second input for receiving said n-bit information words, and a third input for receiving a last two bits ($x_m, x_{m-1}$) of said m-bit code words, said memory circuit forming the (m−n)-bit words from said digital sum variation, said m-bit information words and said last two bits of said code words.

7. A channel encoder as claimed in claim 6, characterized in that in the memory circuit is provided for forming a 2-bit word ($x_a, x_b$) upon reception of the n-bit information word and said digital sum variation, the memory circuit further comprises two EXCLUSIVE-OR gates which, in response to the bits $x_a$ and $x_b$ and to the bits $x_m$ and $x_{m-1}$, supply the bits $x'_a$ and $x'_b$, respectively, to be added to the n-bit information word.

8. A channel encoder as claimed in claim 7, characterized in that the memory circuit comprises a first sub-memory which determines a first partial digital sum value ($DS_a$) in response to the even bits of the n-bit information word, a second sub-memory which supplies a second partial digital sum value ($DS_b$) in response to the odd bits of the n-bit information word, and a third sub-memory which derives said 2-bit word ($x_a, x_b$) from the first and the second partial digital sum value ($DS_a$, $DS_b$) and the digital sum variation.

9. A channel encoder as claimed in claim 8, characterized in that in the first and the second sub-memory there are stored digital sum values ($DS_a$, $DS_b$) which have been formed by appending each time the 1-bit word $x'_a$, $x'_b$, respectively, having a predetermined value, to said even bits and odd bits, respectively, the combination thus obtained passed the precoder, the last two bits of fixed value of the preceding m-bit code word supplied by the precoder having been applied to the precoder.

* * * * *